United States Patent
Park et al.

(10) Patent No.: US 12,354,849 B2
(45) Date of Patent: Jul. 8, 2025

(54) PLASMA PROCESSING APPARATUS

(71) Applicant: Tokyo Electron Limited, Tokyo (JP)

(72) Inventors: Gyeong min Park, Miyagi (JP); Nobutaka Sasaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 437 days.

(21) Appl. No.: 17/835,996

(22) Filed: Jun. 9, 2022

(65) Prior Publication Data
US 2022/0406575 A1    Dec. 22, 2022

(30) Foreign Application Priority Data

Jun. 18, 2021   (JP) ................................. 2021-101788

(51) Int. Cl.
*H01J 37/32* (2006.01)
*H01L 21/683* (2006.01)
*H01L 21/687* (2006.01)

(52) U.S. Cl.
CPC .. *H01J 37/32715* (2013.01); *H01J 37/32449* (2013.01); *H01J 37/32642* (2013.01); *H01J 37/32733* (2013.01); *H01L 21/6833* (2013.01); *H01L 21/68742* (2013.01)

(58) Field of Classification Search
CPC ........... H01J 37/32715; H01J 37/32449; H01J 37/32642; H01J 37/32733; H01L 21/6831; H01L 21/6833; H01L 21/68742
See application file for complete search history.

(56) References Cited

U.S. PATENT DOCUMENTS

| | | | |
|---|---|---|---|
| 2003/0015141 A1* | 1/2003 | Takagi | H01L 21/68735 118/728 |
| 2007/0212200 A1* | 9/2007 | Ueda | H01L 21/68757 414/217 |
| 2010/0271744 A1* | 10/2010 | Ni | H01L 22/14 361/233 |
| 2011/0315080 A1* | 12/2011 | Choi | H01L 21/68742 118/500 |
| 2020/0219753 A1* | 7/2020 | Uchida | H01J 37/32715 |
| 2020/0234981 A1* | 7/2020 | Schmid | H01L 21/68785 |
| 2022/0122878 A1* | 4/2022 | Wu | H01L 21/68714 |

FOREIGN PATENT DOCUMENTS

| | | |
|---|---|---|
| JP | 2020-130603 A | 8/2020 |
| WO | 2020/231611 A1 | 11/2020 |

* cited by examiner

*Primary Examiner* — Andrew L Swanson
(74) *Attorney, Agent, or Firm* — XSENSUS LLP

(57) ABSTRACT

A plasma processing apparatus, comprising a plasma processing chamber; a plasma generator to generate a plasma from a processing gas in the plasma processing chamber; and a substrate support disposed in the plasma processing chamber, is provided. The substrate support includes a base; an electrostatic chuck disposed above the base; a first annular member to surround a substrate on the substrate support; a second annular member disposed below the first annular member and having a plurality of through holes; a plurality of lift pins disposed to correspond to the respective through holes, each lift pin having an upper portion to support the first annular member through the corresponding through hole and a lower portion; at least one spacer fixed to at least one of the lift pins, disposed on the lower portion so as to surround the upper portion and support the second annular member; and at least one actuator to vertically move the lift pins.

15 Claims, 13 Drawing Sheets

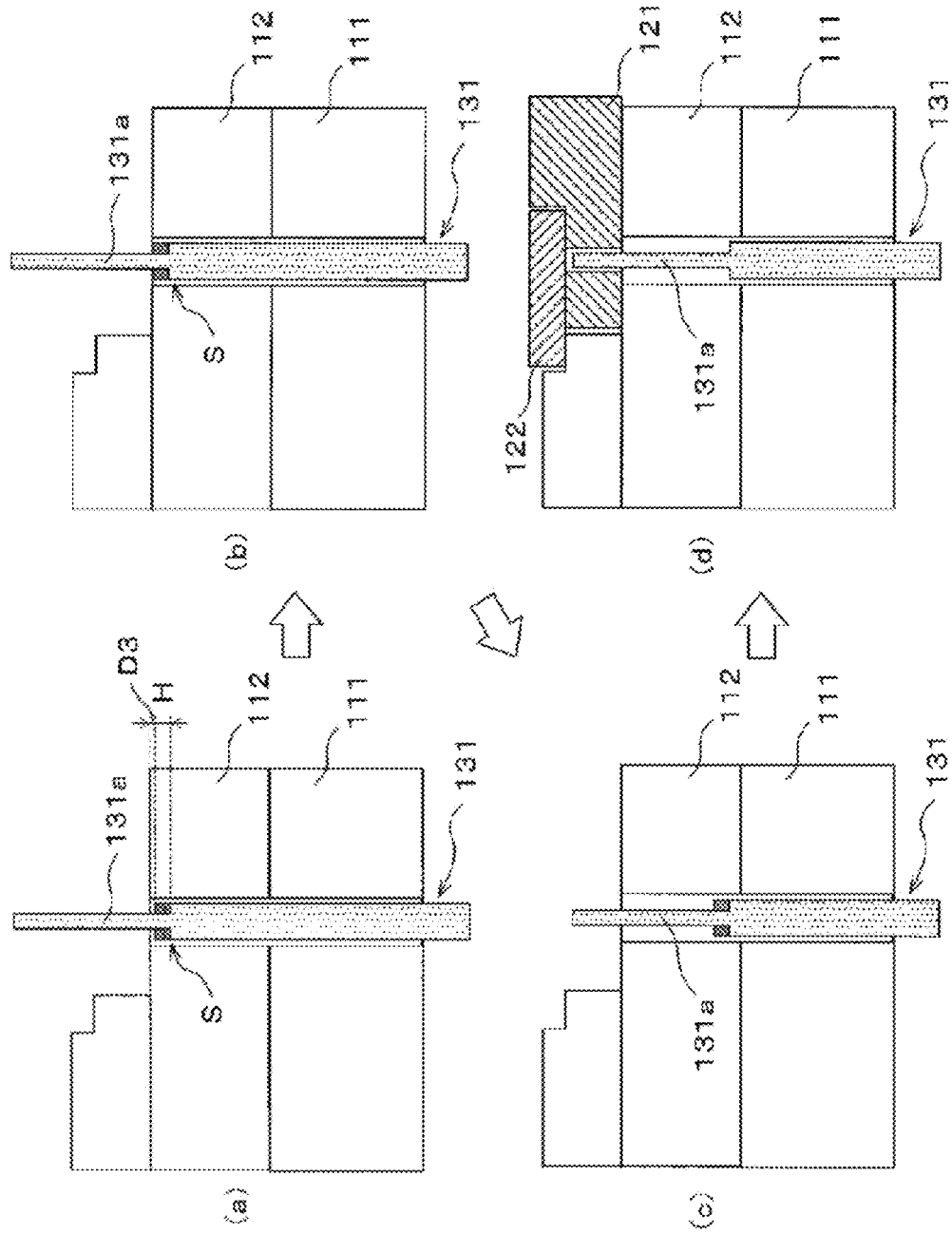

PLASMA PROCESSING APPARATUS

CROSS-REFERENCE TO RELATED APPLICATION

This application claims priority to Japanese Patent Application No. 2021-101788 filed on Jun. 18, 2021, the entire contents of which are incorporated herein by reference.

TECHNICAL FIELD

The present disclosure relates to a plasma processing apparatus.

BACKGROUND

Japanese Laid-open Patent Publication No. 2020-130603 discloses a mounting table having a lifter pin that supports a first ring and a second ring mounted on a ring mounting surface from below and lifts the rings up and down. A through hole through which the lifter pin is inserted is formed in the second ring. The lifter pin described in Japanese Laid-open Patent Publication No. 2020-130603 is configured by connecting a first holder, which has a diameter smaller than that of the through hole and is inserted into the through hole to support the first ring, to a second holder, which has a diameter larger than that of the through hole and supports the second ring by a protrusion protruding from an outer periphery of the first holder, in an axial direction.

Further, International Publication No. WO 2020/231611 discloses a lift pin mechanism used when a top ring and a middle ring are replaced in a substrate processing system. The lift pin mechanism described in International Publication No. WO 2020/231611 includes an upper member inserted into a through hole formed in a lower electrode to engage with a lower surface of the top ring, and a lower member configured to engage with a lower surface of the through hole.

SUMMARY

The present disclosure provides a plasma processing apparatus with a lift pin mechanism capable of appropriately lifting a ring assembly used for plasma processing up and down.

One aspect of the present disclosure provides a plasma processing apparatus comprising: a plasma processing chamber; a plasma generator configured to generate a plasma from a processing gas in the plasma processing chamber; and a substrate support disposed in the plasma processing chamber, wherein the substrate support includes: a base; an electrostatic chuck disposed above the base and having a substrate support surface; a first annular member disposed to surround a substrate on the substrate support surface; a second annular member disposed below the first annular member and having a plurality of through holes; a plurality of lift pins disposed to correspond to the respective through holes, each lift pin having an upper portion having a first width and a lower portion having a second width larger than the first width, wherein the upper portion is configured to support the first annular member through the corresponding through hole of the second annular member; at least one spacer fixed to at least one of the plurality of lift pins, the spacer being disposed on the lower portion so as to surround the upper portion, and the spacer being configured to support the second annular member; and at least one actuator configured to vertically move the plurality of lift pins.

BRIEF DESCRIPTION OF THE DRAWINGS

FIG. 12B is a diagram showing a series of steps for determining the thickness of the spacer.

DETAILED DESCRIPTION

Figure 1:
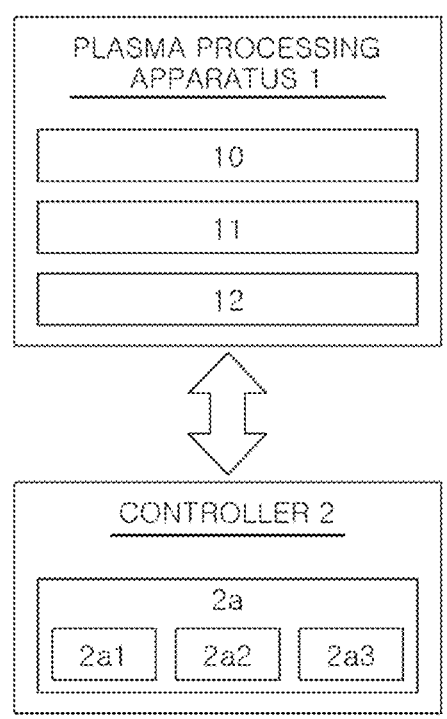
FIG. 1 is a schematic diagram showing an example of a configuration of a plasma processing system according to an embodiment.

In a manufacturing process of a semiconductor device, a variety of plasma processing such as etching processing, film formation processing, and diffusion processing is performed on a semiconductor substrate (hereinafter, simply referred to as a "substrate") supported by a substrate support by exciting a processing gas supplied into a chamber and generating a plasma. In the plasma processing, a plurality of annular members (hereinafter, the plurality of annular members are collectively referred to as a "ring assembly") such as an edge ring and a cover ring are disposed to surround the substrate supported by the substrate support.

In loading and unloading of the ring assembly to or from the substrate support, each of the plurality of annular members is lifted up and lowered down to a specified height at which delivery to or from a transport arm is performed using a lift pin having one or more stepped portions in an axial direction. However, when the plurality of annular members are lifted up and lowered down using the same lift pin in this way, and a position of the lift pin is adjusted to a lifting position of one annular member, other annular members may not be appropriately lifted up and lowered down to a specified height and transport efficiency of the ring assembly may decrease due to such an adjustment amount and a loading tolerance.

In order to appropriately lift up and lower down each of the annular members, it is necessary to adjust a height (a formation position) of each of the stepped portions of the lift pin so as to respectively correspond to each of the plurality of annular members. However, it is difficult to adjust the heights of the respective stepped portions in this way, and this issue is neither described nor suggested in Japanese Laid-open Patent Publication No. 2020-130603 and International Publication No. WO 2020/231611.

The technique according to the present disclosure has been made in view of the above circumstances and provides a plasma processing apparatus with a lift pin mechanism capable of appropriately lifting up and lowering down a ring assembly used for plasma processing. Hereinafter, a plasma processing system with the plasma processing apparatus according to the present embodiment will be described with reference to the accompanying drawings. In the specification and the drawings, elements having substantially the same functional configuration are designated by the same reference numerals, and duplicate description thereof will be omitted.

Plasma Processing System

In one embodiment, the plasma processing system includes a plasma processing apparatus 1 and a controller 2 as shown in FIG. 1. The plasma processing apparatus 1 includes a plasma processing chamber 10, a substrate support 11, and a plasma generator 12. The plasma processing chamber 10 has a plasma processing space. Further, the plasma processing chamber 10 has at least one gas supply port for supplying at least one processing gas into the plasma processing space, and at least one gas discharge port for discharging gas from the plasma processing space. The gas supply port is connected to the gas supply 20, which will be described below, and the gas discharge port is connected to an exhaust system 40 that will be described below. The substrate support 11 is disposed in the plasma processing space and has a substrate support surface for supporting the substrate.

The plasma generator 12 is configured to generate a plasma from at least one processing gas supplied into the plasma processing space. The plasma formed in the plasma processing space may be a capacitively coupled plasma (CCP), an inductively coupled plasma (ICP), an electron-cyclotron-resonance (ECR) plasma, a helicon wave plasma (HWP), a surface wave plasma (SWP), or the like. Further, various types of plasma generators including an alternating current (AC) plasma generator and a direct current (DC) plasma generator may be used. In one embodiment, an AC signal (AC power) used in the AC plasma generator has a frequency in a range of 100 kHz to 10 GHz. Therefore, the AC signal includes a radio frequency (RF) signal and a microwave signal. In one embodiment, the RF signal has a frequency in a range of 200 kHz to 150 MHz.

The controller 2 processes computer-executable instructions that cause the plasma processing apparatus 1 to perform various steps described in the present disclosure. The controller 2 may be configured to control each component of the plasma processing apparatus 1 to perform the various steps described herein. In one embodiment, a part or the whole of the controller 2 may be included in the plasma processing apparatus 1. The controller 2 may include, for example, a computer 2*a*. The computer 2*a* may include, for example, a central processing unit (CPU) 2*a*1, a memory part 2*a*2, and a communication interface 2*a*3. The CPU 2*a*1 may be configured to perform various control operations based on a program stored in the memory part 2*a*2. The memory part 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 via a communication line such as a local area network (LAN).

Plasma Processing Apparatus

Figure 2:
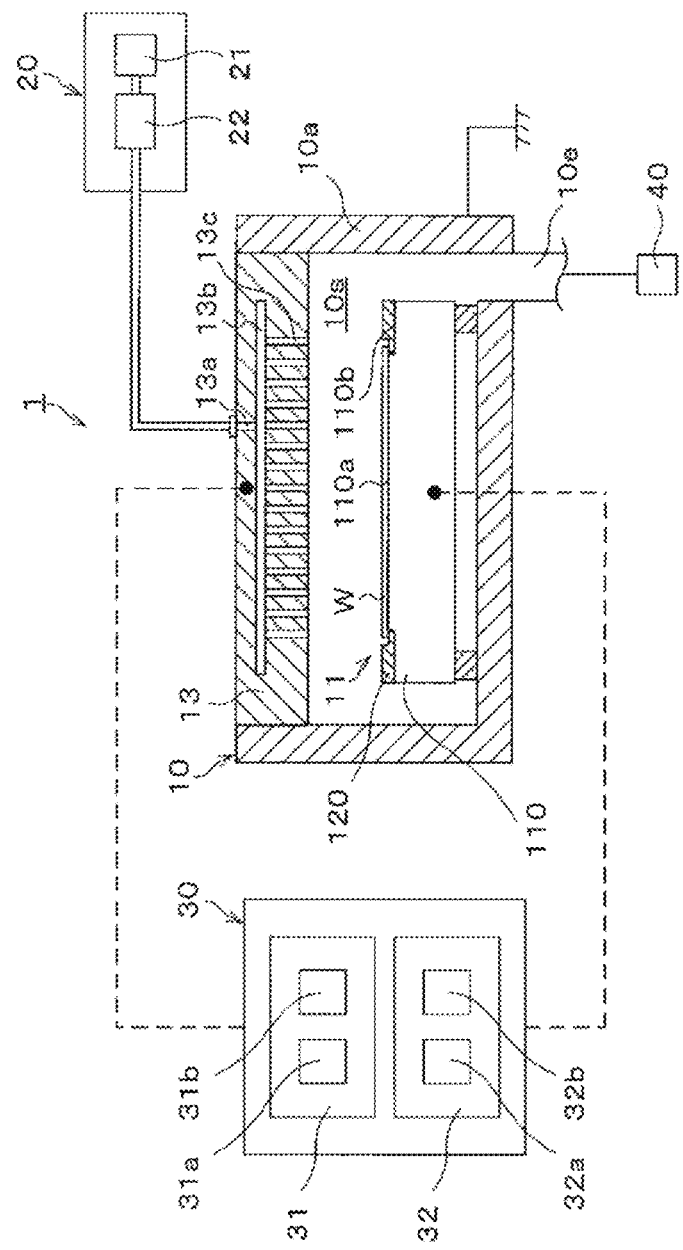
FIG. 2 is a longitudinal cross-sectional view showing an example of a configuration of a plasma processing apparatus according to the embodiment.

Next, as an example of the above-described plasma processing apparatus 1, an example of a configuration of a capacitive coupling plasma processing apparatus 1 will be described. FIG. 2 is a longitudinal cross-sectional view showing an outline of the configuration of the plasma processing apparatus 1.

The plasma processing apparatus 1 includes the plasma processing chamber 10, the gas supply 20, a power source 30, and the exhaust system 40. Further, the plasma processing apparatus 1 includes a substrate support 11 and a gas introduction part. The substrate support 11 is disposed in the plasma processing chamber 10. The gas introduction part is configured to introduce at least one processing gas into the plasma processing chamber 10. The gas introduction part includes a shower head 13. The shower head 13 is disposed above the substrate support 11. In one embodiment, the shower head 13 constitutes at least a portion of the ceiling of the plasma processing chamber 10. A plasma processing space 10*s* defined by the shower head 13, a side wall 10*a* of the plasma processing chamber 10, and the substrate support 11 is formed inside the plasma processing chamber 10. The plasma processing chamber 10 has at least one gas supply port for supplying at least one processing gas into the plasma processing space 10*s*, and at least one gas discharge port for discharging gas from the plasma processing space 10*s*. The side wall 10*a* is grounded. The shower head 13 and the substrate support 11 are electrically insulated from the plasma processing chamber 10.

Figure 3:
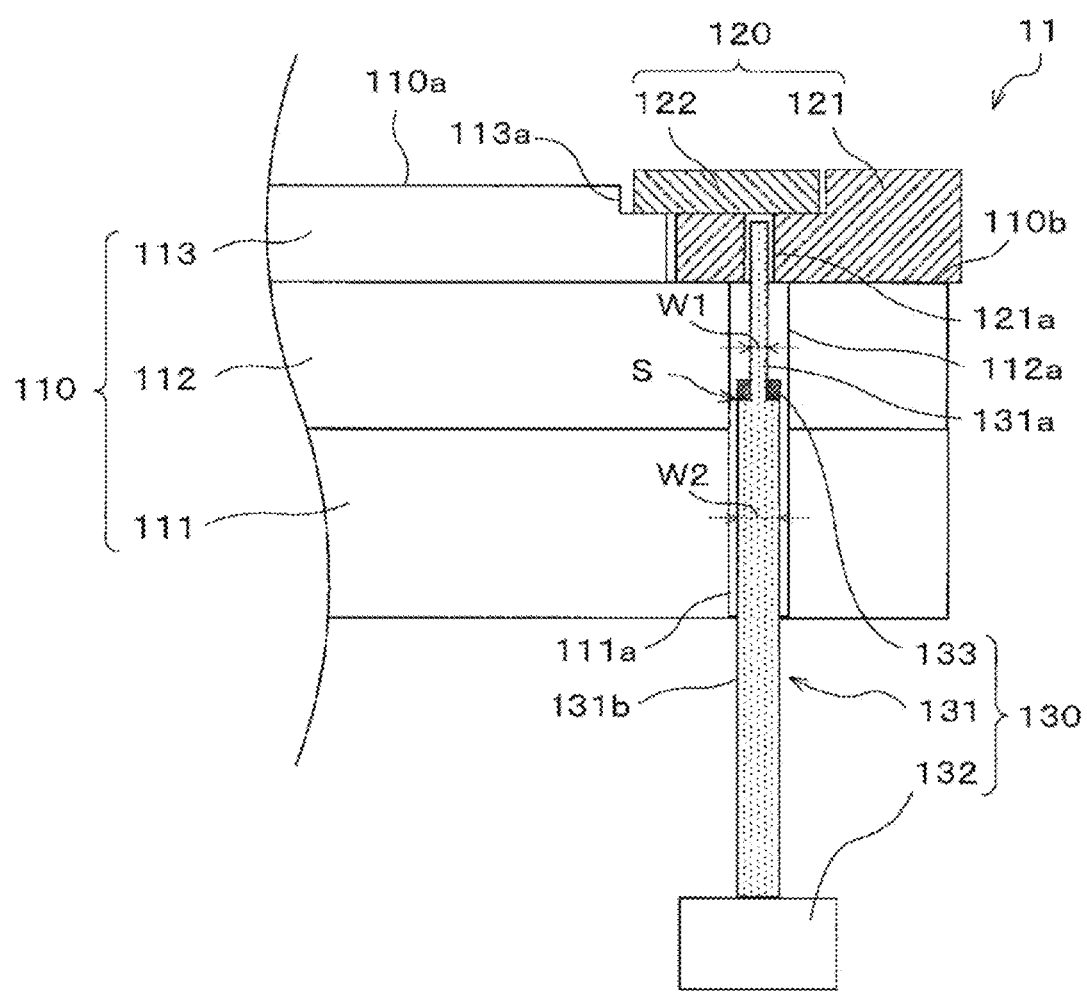
FIG. 3 is a schematic view showing an example of a configuration of a substrate support according to the embodiment.

The substrate support 11 includes a main body 110, a ring assembly 120, and a lifter 130 (refer to FIG. 3). The upper surface of the main body 110 has a central region 110*a* (a substrate support surface) for supporting the substrate (a wafer) W and an annular region 110*b* (a ring support surface) for supporting the ring assembly 120. The annular region 110*b* surrounds the central region 110*a* in a plan view. The substrate W is disposed on the central region 110*a*, and the ring assembly 120 is disposed on the annular region 110*b* to surround the substrate W placed on the central region 110*a*. The lifter 130 moves the ring assembly 120 in a vertical direction as will be described below, and delivers the ring assembly 120 to or from a transport arm (not shown) provided outside the plasma processing apparatus 1.

As shown in FIG. 3, in one embodiment, the main body 110 includes a metal plate 111, a conductive base 112, and an electrostatic chuck 113. The metal plate 111, the conductive base 112, and the electrostatic chuck 113 are stacked and disposed in that order from the floor surface side of the plasma processing chamber 10. The electrostatic chuck 113 has the above-described substrate support surface.

The metal plate 111 is disposed and fixed on the floor surface of the plasma processing chamber 10 and serves as a support for the conductive base 112 and the electrostatic chuck 113. Further, a plurality of (for example, 3 in the present embodiment) through holes 111a passing through the metal plate 111 in a thickness direction are formed. As shown in FIG. 3, a lift pin 131 which will be described below is inserted into and passes through the through hole 111a.

The conductive base 112 is a base configured of a non-magnetic conductive member such as an Al alloy. The conductive member of the conductive base 112 serves as a lower electrode. The electrostatic chuck 113, which will be described below, is disposed on the inner side of the surface of the conductive base 112 in a radial direction, and the outer side of the upper surface of the electrostatic chuck 113 in the radial direction constitutes the above-described annular region 110b (the ring support surface). In other words, the ring assembly 120 is disposed on the conductive base 112 to surround the electrostatic chuck 113.

Further, a plurality of (for example, 3 in the present embodiment) through holes 112a passing through the conductive base 112 in the thickness direction are formed. The through hole 112a is formed at a position corresponding to the through hole 111a formed in the metal plate 111, and a lift pin 131 described below is inserted thereinto and passes therethrough as shown in FIG. 3. The through hole 112a has the same diameter as, for example, the through hole 111a.

The upper surface of the electrostatic chuck 113 constitutes the above-described central region 110a (the substrate support surface). An adsorption electrode (not shown) for adsorbing and holding the substrate W in the central region 110a is provided inside the electrostatic chuck 113. The electrostatic chuck 113 is configured by sandwiching an adsorption electrode between a pair of dielectric films made of a non-magnetic dielectric such as ceramics.

Further, a notch 113a is formed at an outer peripheral end portion of the upper surface of the electrostatic chuck 113. At least a part of the edge ring 122 is supported by the notch 113a as shown in FIG. 3.

The ring assembly 120 includes a plurality of annular members. As shown as an example in FIG. 3, the ring assembly 120 includes a cover ring 121 and an edge ring 122 as the plurality of annular members. The cover ring 121 and the edge ring 122 are stacked in that order and supported by the annular region 110b (the ring support surface). Further, the ring assembly 120 is configured to be lifted up from the annular region 110b (the ring support surface) by an operation of the lifter 130 described below and thus to enable delivery to or from a transfer arm (not shown) disposed outside the plasma processing apparatus 1.

The cover ring 121 is a second annular member made of an insulator such as quartz. The cover ring 121 has a stepped portion formed on the upper portion thereof, and the upper surface of the outer peripheral portion thereof is formed to be higher than the upper surface of the inner peripheral portion thereof. The upper surface of the inner peripheral portion of the cover ring 121 constitutes a support surface of the edge ring 122. Further, in the present embodiment, a plurality of (for example, 3 in the present invention) through holes 121a passing through the inner peripheral portion of the cover ring 121 in the thickness direction are formed. The through hole 121a is formed at a position corresponding to the through hole 112a formed in the conductive base 112, and as shown in FIG. 3, a first pin portion 131a of the lift pin 131, which will be described below, is inserted thereinto and passes therethrough. The through hole 121a has a smaller diameter than at least the through hole 112a.

The edge ring 122 is a first annular member that may be called a focus ring and improves in-plane uniformity in plasma processing with respect to the substrate W. The edge ring 122 may be formed of silicon, silicon carbide, quartz, or the like. In one embodiment, the first annular member 122 is disposed to surround the substrate on the substrate support surface, and the second annular member 121 is disposed below the first annular member 122. In one embodiment, the first annular member 122 is supported by the second annular member 121.

As shown in FIG. 3, in one embodiment, the lifter 130 includes a lift pin 131, an actuator 132, and a spacer 133 (shim). A plurality of (for example, 3 in the present embodiment) lift pins 131 are provided to correspond to the through holes 121a formed in the cover ring 121. Further, the lift pins 131 include a plurality of pin portions having different diameters. As shown as an example in FIG. 3, the lift pins 131 include a first pin portion 131a and a second pin portion 131b as the plurality of pin portions. The first pin portion 131a and the second pin portion 131b are integrally configured.

Figure 4A:
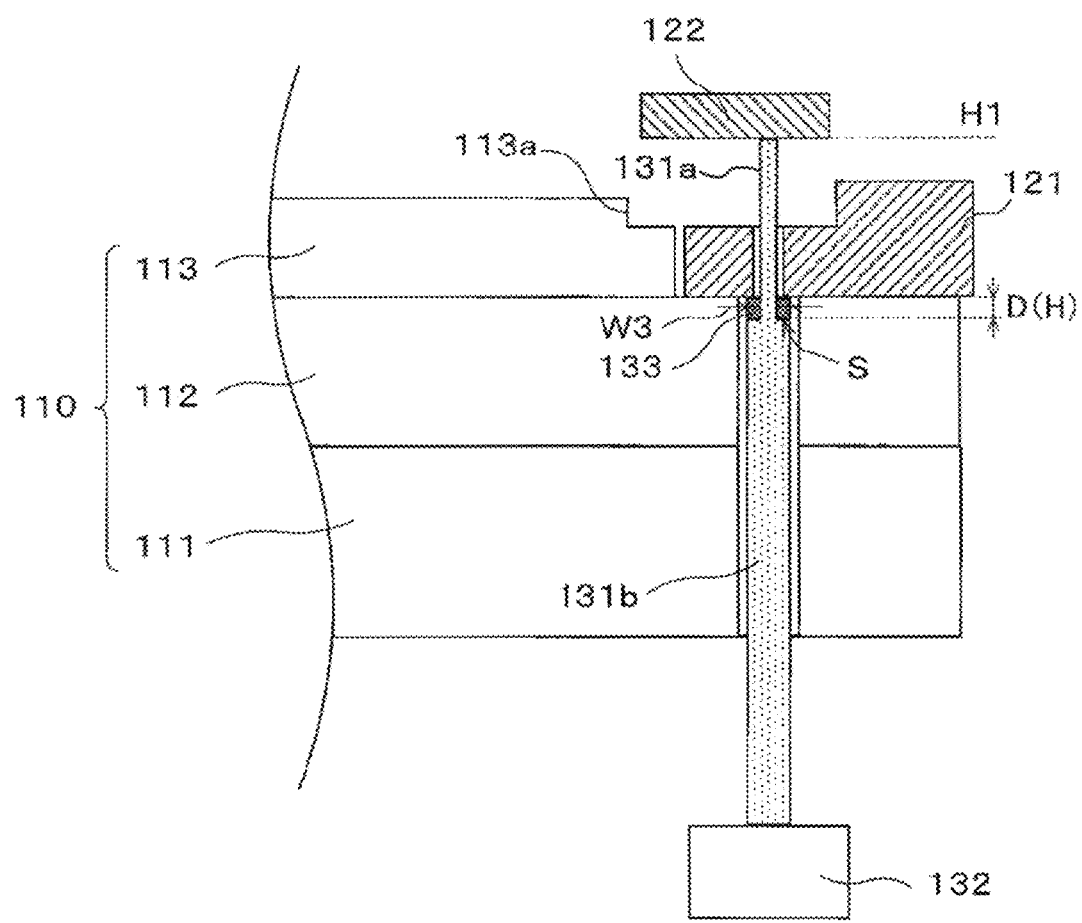
FIG. 4A is a diagram showing a state when an edge ring is lifted up.

The first pin portion 131a is an upper portion that has a smaller diameter (a first width W1 in FIG. 3) than at least the through hole 121a formed in the cover ring 121. The first pin portion 131a is connected in the axial direction from the upper surface of the second pin portion 131b described below and moves in the vertical direction (the axial direction) integrally with the second pin portion 131b by an operation of the actuator 132. The first pin portion 131a is configured to go into and come out of the upper surface of the inner peripheral portion of the cover ring 121 via the through hole 121a, and thereby supports the lower surface of the edge ring 122 supported on the upper surface of the cover ring 121 and moves (lifts up) the edge ring 122 in the vertical direction, as shown in FIG. 4A.

Figure 4B:
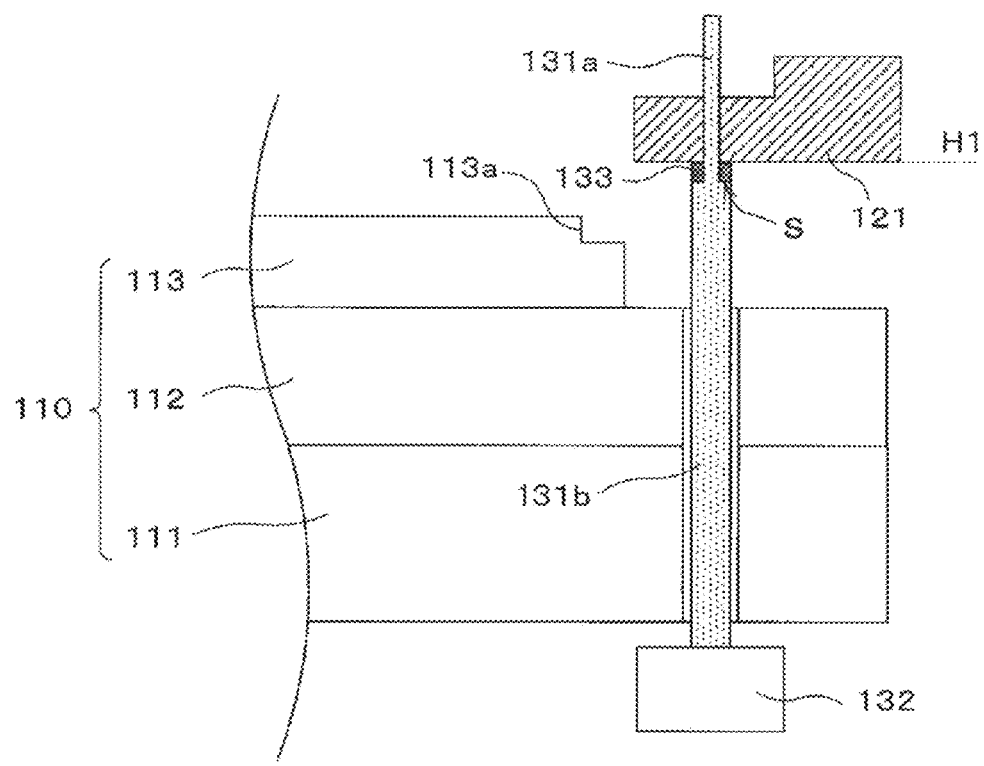
FIG. 4B is a diagram showing a state when a cover ring is lifted up.

The second pin portion 131b is a lower portion that has a larger diameter (a second width W2 in FIG. 3) than at least the through hole 121a formed in the cover ring 121. That is, the second pin portion 131b has a stepped portion S on the upper surface thereof which protrudes radially outward from an outer periphery of the first pin portion 131a. The second pin portion 131b is configured to support the lower surface of the through hole 121a (the lower surface of the cover ring 121) by the stepped portion S, and thereby supports the lower surface of the cover ring 121 and moves (lifts up) the cover ring 121 in the vertical direction, as shown in FIG. 4B. In one embodiment, the plurality of lift pins 131 are each disposed to correspond to one of the plurality of through holes 121a of the second annular member 121. Each of the lift pins 131 has the upper portion 131a having a first width W1 and the lower portion 131b having a second width W2 larger than the first width W1. The upper portion 131a is configured to support the first annular member 122 via the corresponding through hole 121a of the second annular member 121. Therefore, the upper portion 131a has a top for supporting the lower surface of the first annular member 122. In one embodiment, the plurality of lift pins 131 comprise a first lift pin, a second lift pin, and a third lift pin. The plurality of through holes 121a comprise a first through hole, a second through hole, and a third through hole. The upper portion of the first lift pin is configured to support the first annular member 122 through a first through hole of the second annular member 121. The upper portion of the second lift pin is configured to support the first annular member 122 through a second through hole of the second annular member 121. The upper portion of the third lift pin is configured to support the first annular member 122 through a third through hole of the second annular member 121.

The actuator 132 moves the lift pin 131 in the vertical direction (the axial direction) to lift up and lower down the ring assembly 120 (the cover ring 121 and the edge ring 122) on the conductive base 112. Thus, the ring assembly 120 is moved to a specified height for delivery to or from the above-described transfer arm (not shown) (hereinafter, simply referred to as "specified height"). Examples of the actuator include an electric actuator, an air cylinder, a motor, and the like.

The number of actuators 132 disposed in the lifter 130 is not particularly limited. That is, for example, the plurality of lift pins 131 may be integrally moved in the vertical direction by one actuator 132. Further, for example, a plurality of actuators 132 may be disposed to respectively correspond to the lift pins 131, and each of the lift pins 131 may be independently moved in the vertical direction. Therefore, at least one actuator 132 is configured to move the plurality of lift pins 131 in the vertical direction. In one embodiment, the single actuator 132 is configured to move the plurality of lift pins 131 in the vertical direction. In one embodiment, the at least one actuator 132 has a plurality of actuators respectively corresponding to the plurality of lift pins 131, and each of the actuators is configured to move the corresponding lift pin 131 in the vertical direction. That is, at least one actuator 132 may comprise a first actuator, a second actuator, and a third actuator. The first actuator is configured to move the first lift pin in the vertical direction. The second actuator is configured to move the second lift pin in the vertical direction. The third actuator is configured to move the third lift pin in the vertical direction.

The spacer 133 is fixed on the stepped portion S formed on the upper surface of the second pin portion 131b to surround the first pin portion 131a. As shown in FIG. 4A, the spacer 133 has a thickness H that substantially coincides with a separation distance D between the lower surface of the cover ring 121 and the stepped portion S when the edge ring 122 is lifted up to the specified height (a first height H1) by the first pin portion 131a. Since the spacer 133 is disposed on the upper surface of the second pin portion 131b (on the stepped portion S) in this way, the spacer 133 supports the lower surface of the through hole 121a (the lower surface of the cover ring 121) instead of the upper surface of the second pin portion 131b and thereby moves (lifts up) the cover ring 121 in the vertical direction.

The spacer 133 does not have to be fixed to all of the plurality of lift pins 131 included in the lifter 130 and may be provided on at least one of the plurality of lift pins 131. Specifically, a gap (the separation distance D) formed between the lower surface of the cover ring 121 and the stepped portion S when the edge ring 122 is lifted up may vary with respect to each of the plurality of lift pins 131 due to a loading tolerance and a machine difference. Therefore, it is sufficient to dispose the spacer 133 only on the lift pin 131 in which the gap (the separation distance D) is formed between the lower surface of the cover ring 121 and the stepped portion S in this way. Therefore, at least one spacer 133 is fixed to at least one of the plurality of lift pins 131. The spacer 133 is disposed on or above the lower portion 131b of the corresponding lift pin 131 to surround the upper portion 131a of the corresponding lift pin 131. The spacer 133 is configured to support the second annular member 121. Therefore, the spacer 133 has an annular support surface for supporting the second annular member 121. In one embodiment, the spacer 133 may have a third width W3 (refer to FIG. 4A). In one embodiment, the third width W3 is substantially identical to the second width W2. The third width W3 can be freely chosen within a range in which the second annular member 121 can be supported. In one embodiment, at least one spacer 133 has a first spacer which is fixed to the first lift pin. In one embodiment, at least one spacer 133 comprise a first spacer, a second spacer, and a third spacer. The first spacer is fixed to the first lift pin. The second spacer is fixed to the second lift pin. The third spacer is fixed to the third lift pin. In one embodiment, the first spacer, the second spacer, and the third spacer are formed to have the same material, thickness and/or shape. In one embodiment, the first spacer, the second spacer, and the third spacer are formed to have different materials, thicknesses and/or shapes.

Further, the material constituting the spacer 133 is not particularly limited and may be at least one material selected from a conductive material such as Si or SiC, and an insulating material such as PCTFE, PTFE, quartz (Qz), sapphire (SA), or $Y_2O_3$.

However, the spacer 133 may be exposed to a plasma atmosphere when the ring assembly 120 is lifted up. Therefore, preferably, the spacer 133 is made of a material having at least radical resistance.

Figure 5A:
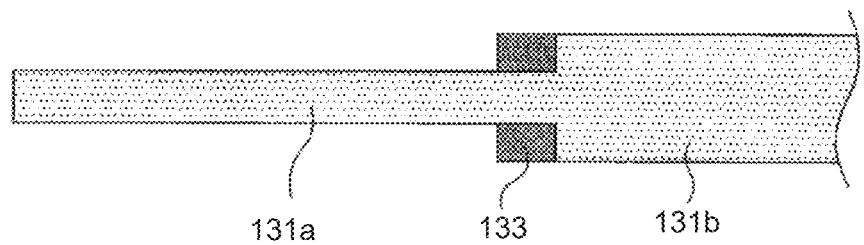
FIG. 5A is a longitudinal cross-sectional view showing an example of fixing a spacer.
Figure 5B:
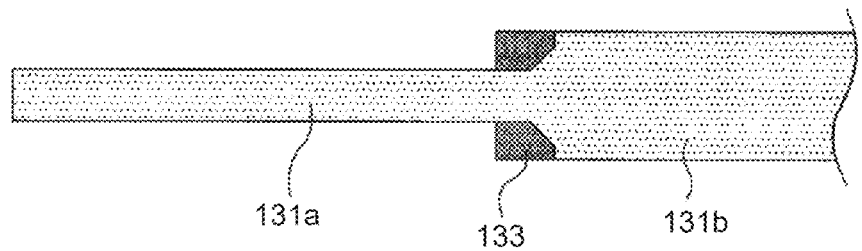
FIG. 5B is a longitudinal cross-sectional view showing an example of fixing the spacer.
Figure 5C:
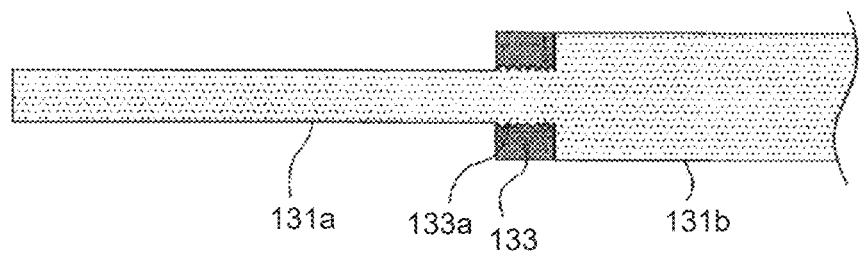
FIG. 5C is a longitudinal cross-sectional view showing an example of fixing the spacer.
Figure 5D:
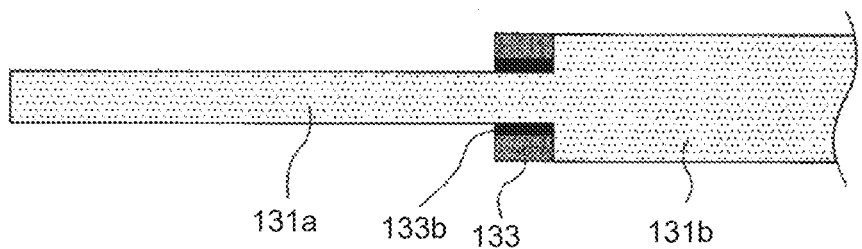
FIG. 5D is a longitudinal cross-sectional view showing an example of fixing the spacer.

Furthermore, a method of fixing the spacer 133 to the lift pin 131 is not particularly limited. Specifically, for example, the spacer 133 may be fixed to the first pin portion 131a by fitting the spacer 133 thereto as shown in FIG. 5A. At this time, a taper may be formed on the first pin portion 131a and the lower portion of the spacer 133 as shown in FIG. 5B. For example, as shown in FIG. 5C, a threaded portion 133a may be formed on the outer peripheral surface of the lower portion of the first pin portion 131a and the inner peripheral surface of the spacer 133, such that the spacer 133 may be fixed to the first pin portion 131a by screw-coupling. In one embodiment, the spacer 133 has a threaded inner peripheral surface, the upper portion 131a of the lift pin 131 has a threaded outer peripheral surface, and the threaded inner peripheral surface and the threaded outer peripheral surface are screwed together. It is possible to appropriately prevent the spacer 133 from being separated from the first pin portion 131a by forming the screw portion and fixing the spacer 133 in this way. For example, as shown in FIG. 5D, an elastic member 133b (for example, FFKM-based rubber) may be disposed inner side of the spacer 133 in the radial direction as an annular drop preventing member, and the spacer 133 may be fixed to the first pin portion 131a by the elastic member 133b. It is possible to prevent the spacer 133 from being separated from the first pin portion 131a and also to suppress occurrence of abnormal discharge between the lift pin 131 and the cover ring 121 by fixing the spacer 133 with the elastic member 133b in this way.

Although not shown, the substrate support 11 may include a temperature control module configured to adjust at least one of the ring assembly 120, the electrostatic chuck 113, and the substrate W to a target temperature. The temperature control module may include a heater, a heat transfer medium, a flow path, or a combination thereof. A heat transfer fluid such as brine or a gas flows through the flow path. Further, the substrate support 11 may include a heat transfer gas supply configured to supply a heat transfer gas (a backside gas) between a back surface of the substrate W and an upper surface of the electrostatic chuck 113.

Returning to the description of FIG. 2, the shower head 13 is configured to introduce at least one processing gas from the gas supply 20 into the plasma processing space 10s. The shower head 13 has at least one gas supply port 13a, at least one gas diffusion chamber 13b, and a plurality of gas introduction ports 13c. The processing gas supplied from the gas supply 20 to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 serves as an upper electrode. In addition to the shower head 13, the gas introduction part may include one or more side gas injectors (SGI) mounted in one or more openings formed in the side wall 10a.

The gas supply 20 may include at least one gas source 21 and at least one flow rate controller 22. In one embodiment, the gas supply 20 is configured to supply at least one processing gas from the corresponding gas source 21 to the shower head 13 via the corresponding flow rate controller 22. Each of the flow rate controllers 22 may include, for example, a mass flow controller or a pressure-controlled flow rate controller. Further, the gas supply 20 may include one or more flow rate modulation devices by the flow rate of at least one processing gas may be made modulated or pulsate.

The power source 30 includes an RF power source 31 coupled to the plasma processing chamber 10 via at least one impedance matching circuit. The RF power source 31 is configured to supply at least one RF signal (RF power), such as a source RF signal and a bias RF signal, to the conductive member (the lower electrode) of the substrate support 11 and/or the conductive member (the upper electrode) of the shower head 13. Thus, a plasma is formed from at least one processing gas supplied into the plasma processing space 10s. Therefore, the RF power source 31 can serve as at least a part of the plasma generator 12. Further, due to the bias RF signal being supplied to the lower electrode, a bias potential is generated in the substrate W, and ionic components in the formed plasma can be drawn into the substrate W.

In one embodiment, the RF power source 31 includes a first RF generator 31a and a second RF generator 31b. The first RF generator 31a is coupled to the lower electrode and/or the upper electrode via at least one impedance matching circuit and is configured to generate a source RF signal (source RF power) for plasma generation. In one embodiment, the source RF signal has a frequency in a range of 13 MHz to 150 MHz. In one embodiment, the first RF generator 31a may be configured to generate a plurality of source RF signals with different frequencies. The one or more generated source RF signals are supplied to the lower electrode and/or the upper electrode. The second RF generator 31b is coupled to the lower electrode via at least one impedance matching circuit and is configured to generate a bias RF signal (bias RF power). In one embodiment, the bias RF signal has a lower frequency than the source RF signal. In one embodiment, the bias RF signal has a frequency in a range of 400 kHz to 13.56 MHz. In one embodiment, the second RF generator 31b may be configured to generate a plurality of bias RF signals with different frequencies. The one or more generated bias RF signals are supplied to the lower electrode. Also, in various embodiments, at least one of the source RF signal and the bias RF signal may be pulsed.

Further, the power source 30 may include a DC power source 32 coupled to the plasma processing chamber 10. The DC power source 32 includes a first DC generator 32a and a second DC generator 32b. In one embodiment, the first DC generator 32a is connected to the lower electrode and is configured to generate a first DC signal. The generated first DC signal is applied to the lower electrode. In one embodiment, the first DC signal may be applied to another electrode such as the adsorption electrode in the electrostatic chuck 113. In one embodiment, the second DC generator 32b is connected to the upper electrode and is configured to generate a second DC signal. The generated second DC signal is applied to the upper electrode. In various embodiments, at least one of the first and second DC signals may be made pulsate. The first and second DC generators 32a and 32b may be provided in addition to the RF power source 31, and the first DC generator 32a may be provided in place of the second RF generator 31b.

The exhaust system 40 may be connected to, for example, a gas discharge port 10e provided in the bottom of the plasma processing chamber 10. The exhaust system 40 may include a pressure adjustment valve and a vacuum pump. An internal pressure of the plasma processing space 10s is adjusted by the pressure adjustment valve. The vacuum pump may include a turbo molecular pump, a dry pump, or a combination thereof.

Although various exemplary embodiments have been described above, various additions, omissions, substitutions, and changes may be made without being limited to the above-described exemplary embodiments. It is also possible to combine components in different embodiments to form other embodiments.

In the plasma processing apparatus 1 configured as described above, the thickness H of the spacer 133 provided in the lifter 130 is set to a thickness H that substantially coincides with the separation distance D between the lower surface of the cover ring 121 and the stepped portion S when the edge ring 122 is lifted up to the specified height (the first height H1) by the first pin portion 131a. In other words, the spacer 133 has a thickness H sufficient for correcting the above-described separation distance D caused by an adjustment amount of a height position of the lift pin 131 set for appropriately transporting the edge ring 122 and a loading tolerance of constituent members of the lifter 130. Thus, in the substrate support 11 according to the present embodiment, after the edge ring 122 is transported by the first pin portion 131a, the lifting of the cover ring 121 can efficiently start without a vertical movement of the lift pin 131 for correcting the separation distance D.

Further, it is possible to reduce a discharge risk during transportation of the ring assembly 120 due to residual charge and the like by arranging the spacer 133 in this way and minimizing the separation distance D (the gap) between the lower surface of the cover ring 121 and the stepped portion S.

Here, the inventors have found that, when the spacer 133 is disposed on the lifter 130 in this way, it is possible to add other functions in addition to the above-described separation distance D (the loading tolerance) correction function by optimizing the shape, material, and the like of the spacer 133. Therefore, the configuration of the spacer 133 according to another embodiment will be described below with reference to the drawings.

Spacer According to Second Embodiment

Figure 6:
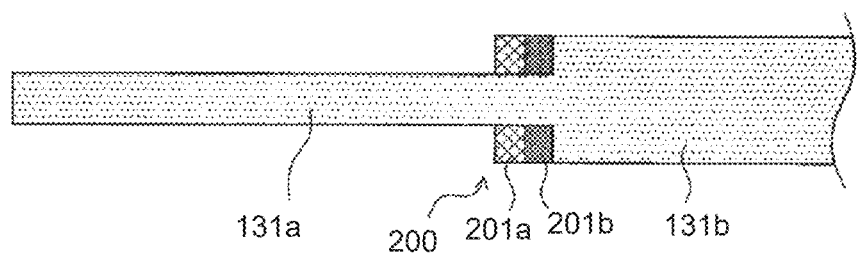
FIG. 6 is a longitudinal cross-sectional view showing an example of another configuration of the spacer.

First, although the spacer 133 is configured of one member in the above embodiment, the spacer may be configured of a plurality of members. Specifically, as shown in FIG. 6, the spacer 200 may have a plurality of members 201 (two members 201a and 201b in an illustrated example) stacked and disposed in the thickness direction (the axial direction of the lift pin 131). In such case, the members 201a and 201b may be made of the same material or may be made of different materials. In such case, although the constituent material of each of the plurality of members 201 is not particularly limited, it is preferable to configure the member 201 (the member 201a in the illustrated example) disposed on the uppermost side (the cover ring 121 side) with at least a material having radical resistance. In one embodiment, the spacer 200 is configured of a stack having a plurality of layers 201a and 201b, and each of the plurality of layers 201a and 201b has an insulating material or a conductive material.

As described above, for each of the plurality of lift pins 131 provided in the lifter 130, the size of the gap (the separation distance D) formed between the lower surface of the cover ring 121 and the stepped portion S may vary due to the loading tolerance and the like. In such a case, the number of members 201 disposed on the stepped portion S may be adjusted according to the size of the formed gap (the separation distance D). In other words, the number of members 201 constituting the spacer 200 may be different for each of the lift pins 131.

According to the present embodiment, the loading tolerance can be appropriately corrected according to the gap (the separation distance D) formed between the lower surface of the cover ring 121 and the stepped portion S by forming the spacer 200 with the plurality of members 201 in this way. Further, at this time, cost can be significantly reduced by manufacturing the member 201 having a small thickness as a standard product and adjusting the number of layers according to the size of the gap (the separation distance D), as compared with a case in which the spacers having different thicknesses according to the size of the gap (the separation distance D) are sequentially manufactured.

Further, the spacer disposed inside the plasma processing apparatus 1 may be worn out due to an influence of, for example, plasma processing, aging deterioration, or the like. According to the present embodiment, since the spacer 200 is configured of the plurality of members 201 in this way, even when the spacer 200 is worn out in this way, it is sufficient to replace only the worn-out member 201, not the entire spacer 200. From this point of view, the cost in the plasma processing apparatus 1 can be reduced.

Spacer According to Third Embodiment

Figure 7A:
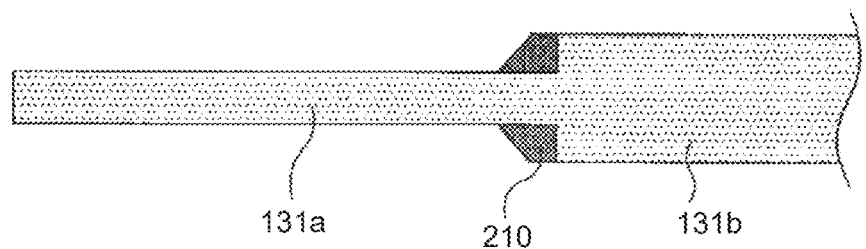
FIG. 7A is a longitudinal cross-sectional view showing an example of yet another configuration of the spacer.
Figure 7B:
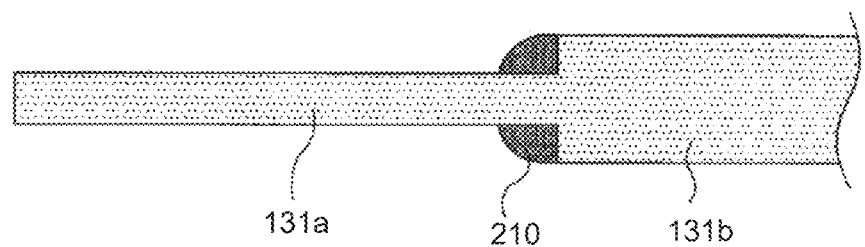
FIG. 7B is a longitudinal cross-sectional view showing an example of still another configuration of the spacer.

Next, although the spacer is configured of an annular member having a simple rectangular shape in a cross-sectional view in the above embodiment, the cross-sectional shape of the spacer is not limited thereto. Specifically, as shown in FIG. 7A or 7B, the upper surface (the shape of the tip end) thereof may be tapered or rounded so that the thickness of a spacer 210 decreases from the inside to the outside in the radial direction. Therefore, the spacer 210 has an annular support surface for supporting a second annular member 121. The annular support surface is inclined downward from the inner periphery (the inside) to the outer periphery (the outside). The annular support surface, that is, the upper portion of the spacer 210, has a tapered or round shape.

According to the present embodiment, since the lower surface of the through hole 121a formed in a cover ring 121 is brought into contact with a tapered portion (a round portion) by applying taper processing or round processing to the upper surface of the spacer 210 in this way, the cover ring 121 can be positioned on an annular region 110b (the ring support surface), and productivity of the plasma processing apparatus 1 can be improved. Further, since the cover ring 121 can be positioned by the spacer 210 in this way, it is not necessary to provide the lift pin 131 with a positioning function. That is, the lift pin 131 can be formed in a simple shape, and thereby the cost related to the manufacture of the plasma processing apparatus 1 can be reduced.

When the tapered portion (the round portion) is formed on the spacer 210 in this way, the lower surface of the cover ring 121 (a lower portion of a through hole 121a) may be formed in a shape which fits with the tapered portion (the round portion). In this case, the positioning effect of the cover ring 121 can be further improved.

When the spacer is configured of the plurality of members as shown in the second embodiment described above, the inclined surface (a tapered shape or a round shape) may be formed only on the member disposed on the uppermost side (the cover ring 121 side).

Spacer According to Fourth Embodiment

Figure 8A:
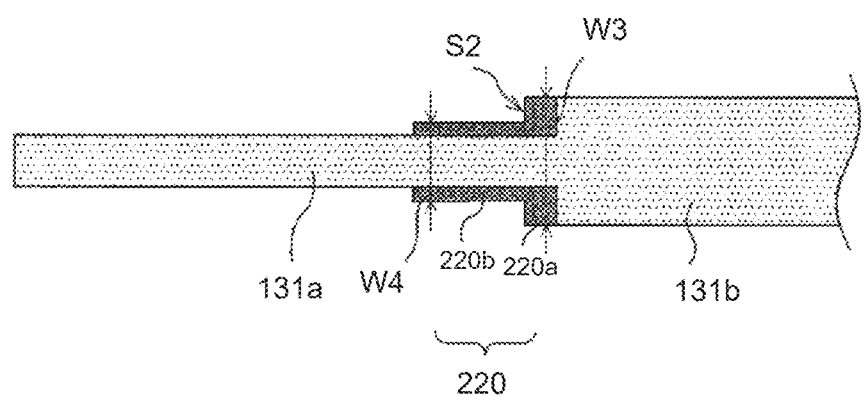
FIG. 8A is a longitudinal cross-sectional view showing an example of yet another configuration of the spacer.

Although the cross-sectional shape of the spacer is configured so that the thickness of the spacer 210 decreases from the inside to the outside in the radial direction in the third embodiment, a stepped portion S2 may be formed on the upper surface thereof, and the upper surface of the inner peripheral portion may be formed higher than the upper surface of the outer peripheral portion, like a spacer 220 shown in FIG. 8A.

In the plasma processing apparatus 1 according to the embodiment, the edge ring 122 and the cover ring 121 are configured to be independently lifted up by forming a stepped portion S on the lift pin 131 as shown in FIG. 3. In such case, for example, when the ring assembly 120 includes a third annular member in addition to the cover ring 121 and the edge ring 122, it is necessary to form a new stepped portion on the lift pin 131 and to lift up the third annular member with the new stepped portion. That is, it is necessary to change the design of the lift pin 131, which requires time and cost for the design change and member replacement.

Figure 8B:
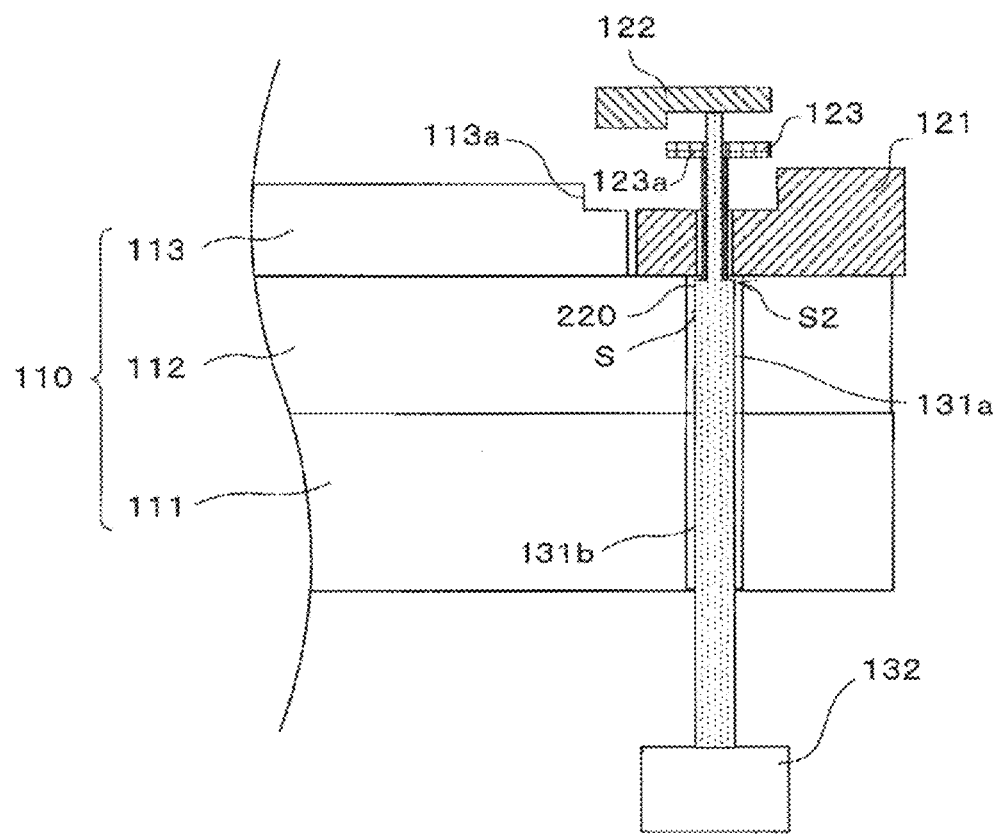
FIG. 8B is a diagram showing a state when a third annular member is lifted up.

According to the present embodiment, since a stepped portion S2 is formed on the upper surface of the spacer 220 in this way, the third annular member 123 can be lifted up as shown in FIG. 8B using the stepped portion S2. That is, even when it is necessary to provide a new annular member in the ring assembly 120, the third annular member 123 can be lifted up only by installing the spacer 220 without the design change of the lift pin 131. Thus, the time and cost can be significantly reduced as compared with the case in which the design of the lift pin 131 is changed. In one embodiment, the substrate support 11 further includes a third annular member 123 disposed between the first annular member 122 and the second annular member 121. The third annular member 123 has a plurality of additional through holes 123a formed so as to respectively correspond to the plurality of through holes 121a of the second annular member 121. The upper portion 131a of the lift pin 131 is configured to support the first annular member 122 via the corresponding through hole 121a of the second annular member 121 and the corresponding additional through hole 123a of the third annular member 123. The spacer 220 has a lower spacer portion 220a having a third width W3 and an upper spacer portion 220b having a fourth width W4 smaller than the third width W3 (refer to FIG. 8A). The upper spacer portion 220b is configured to support the third annular member 123 via the corresponding through hole 121a of the second annular member 121. Therefore, the upper spacer portion 220b has an annular support surface for supporting the third annular member 123. The lower spacer portion 220a is configured to support the second annular member 121. Therefore, the lower spacer portion 220a has an annular support surface for supporting the second annular member 121.

Spacer According to Fifth Embodiment

Figure 9:
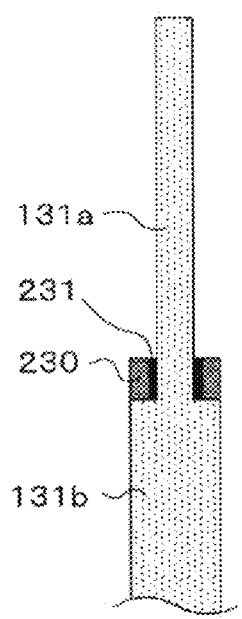
FIG. 9 is a longitudinal cross-sectional view showing an example of another configuration of the spacer.

Although the spacer is made of at least one material selected from, for example, PCTFE, PTFE, Qz, SA, and the like in the above embodiments, as shown in FIG. 9, an elastic member 231 (for example, FFKM-based rubber or the like) may be provided as a drop preventing member between a spacer 230 and a first pin portion 131a (refer also to FIG. 5D).

According to the present invention, since an elastic member 231 is disposed between the spacer 230 and the first pin portion 131a in this way, the spacer 230 can be fixed to the first pin portion 131a by an elastic force of the elastic member 231, and separation thereof can be appropriately suppressed. Further, for example, when the spacer 230 has an insulating property, abnormal discharge between the first pin portion 131a and the cover ring 121 can be suppressed by improving a pressure resistance due to installation of the elastic member 231. Further, for example, when the spacer 230 has conductivity, the installation of the spacer 230 imparts conductivity to the first pin portion 131a, and thus charging of the first pin portion 131a can be prevented and the abnormal discharge can be suppressed.

Spacer According to Sixth Embodiment

As shown in FIG. 3, the substrate support 11 may be configured by stacking a plurality of members (the metal plate 111, the conductive base 112, and the electrostatic chuck 113 in the illustrated example). In this case, positions of the through holes (the through holes 111a and 112a in the illustrated example) formed in each member may be misaligned due to a difference in temperature and a coefficient of thermal expansion of each member. In such case, when the first pin portion 131a and the second pin portion 131b of the lift pin 131 are integrally configured as described above, the ring assembly 120 may not be appropriately lifted up due to the misalignment of the through hole, or the lift pin 131 may be damaged. Therefore, as shown in FIG. 10A, the lift pin 131 provided in the lifter 130 may have a separable pin structure in which a fixed member 240, which is connected to an actuator 132, and a movable portion 241, which moves in a horizontal direction following the misalignment in the position of the through hole, are independently configured.

Figure 10A:
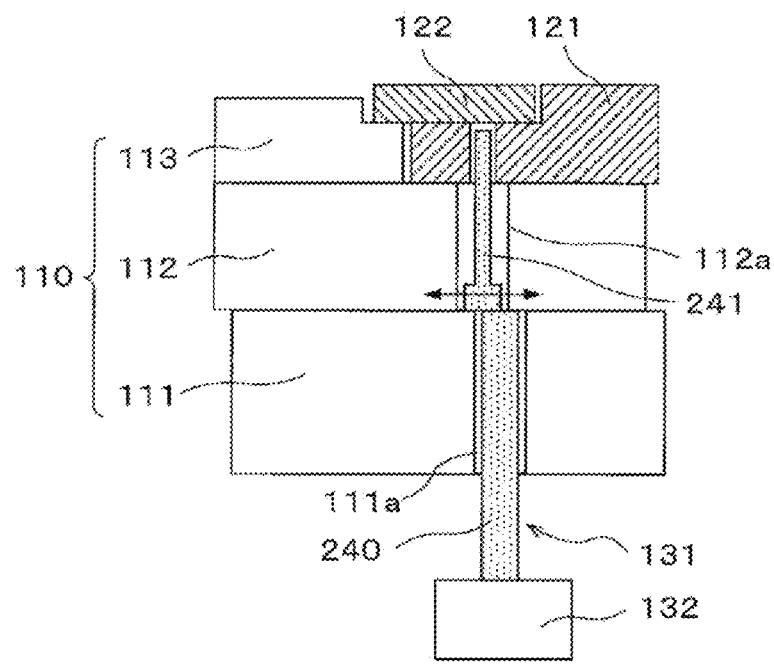
FIG. 10A is a longitudinal cross-sectional view showing an example of another configuration of the lift pin.
Figure 10B:
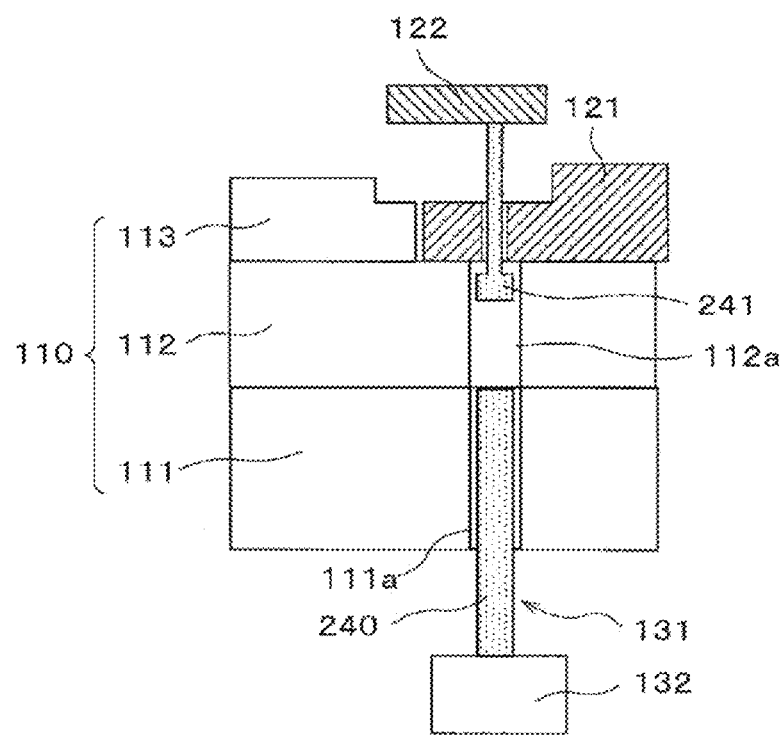
FIG. 10B is a diagram of a state in which a movable portion of a lift pin is lifted up.

However, when the lift pin 131 has a separable pin structure in this way, after the ring assembly 120 is lifted up, only the fixed member 240 may be lowered, and the movable portion 241 may be left lifted up as shown in FIG. 10B.

Figure 11:
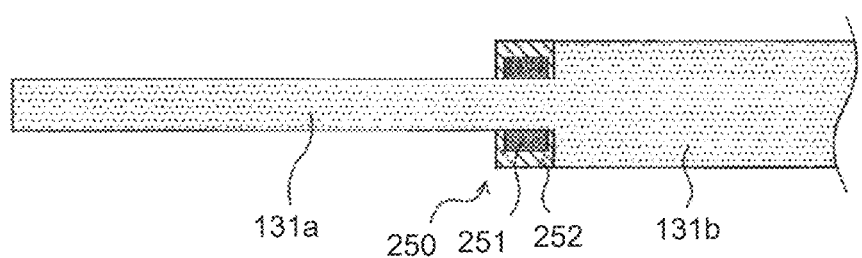
FIG. 11 is a longitudinal cross-sectional view showing an example of yet another configuration of the spacer.

Therefore, in a spacer 250 according to the sixth embodiment, when the lift pin 131 has the separable pin structure in this way, the movable portion 241 is prevented from being left up. Specifically, as shown in FIG. 11, the spacer 250 is configured of a high specific gravity member 251 (for example, titanium, tungsten, or the like), and a coating layer 252 (for example, PCTFE, PTFE, or the like) is formed to cover the surface thereof in order to protect the high specific gravity member 251 from radicals and the like.

Although the above description has been made under the assumption that the fixed member 240 is a part of the lift pin 131 having the separable pin structure as shown in FIGS. 10A and 10B, the fixed member 240 may also be regarded as a substrate support 11 fixed to the actuator 132. In such a case, the movable portion 241 and the spacer 250 shown in FIG. 10 form the lift pin 131 according to the technique of the present disclosure, and the fixed member 240 constitutes a part of the substrate support 11. In other words, the movable portion 241 is supported as the lift pin 131 from below by the fixed member 240 and is connected to the actuator 132 via the fixed member 240. In one embodiment, the substrate support 11 further includes a fixed member 240 fixed to at least one actuator 132, and the lift pin 131 is supported by the fixed member 240. The spacer 250 has the high specific gravity member 251 and the coating layer 252 formed to cover the surface of the high specific gravity member 251.

Thus, the weight of the movable portion 241 is increased by the spacer 250, and even when the movable portion 241 remains lifted up after the ring assembly 120 is lifted up, the movable portion 241 can be lowered down to a standby position by its own weight.

Although various embodiments have been described above, effects added to the spacer are not limited to the above-described exemplary embodiments. Further, it is also possible to form another embodiment by combining the respective components of the above first to sixth embodiments. For example, as described above, the spacer may be configured of a plurality of members (the second embodiment), and the tapered portion (the round portion) may be formed on the member disposed at the uppermost position (the cover ring 121 side) (the third embodiment). Further, for example, the stepped portion S2 may be formed on the spacer (the fourth embodiment), and the elastic member may be further disposed inside the spacer in the radial direction (the fifth embodiment).

Method of Designing Spacer

Next, a method of designing the spacer configured as described above, more specifically, a method of determining the thickness H of the spacer, will be described with reference to the drawings. The method of determining the thickness H of the spacer shown below is performed at the time of starting-up of the plasma processing apparatus 1 or immediately after the replacement of the ring assembly 120, that is, at the time of initial setting of the lifter 130 with respect to the ring assembly 120.

Figure 12A:
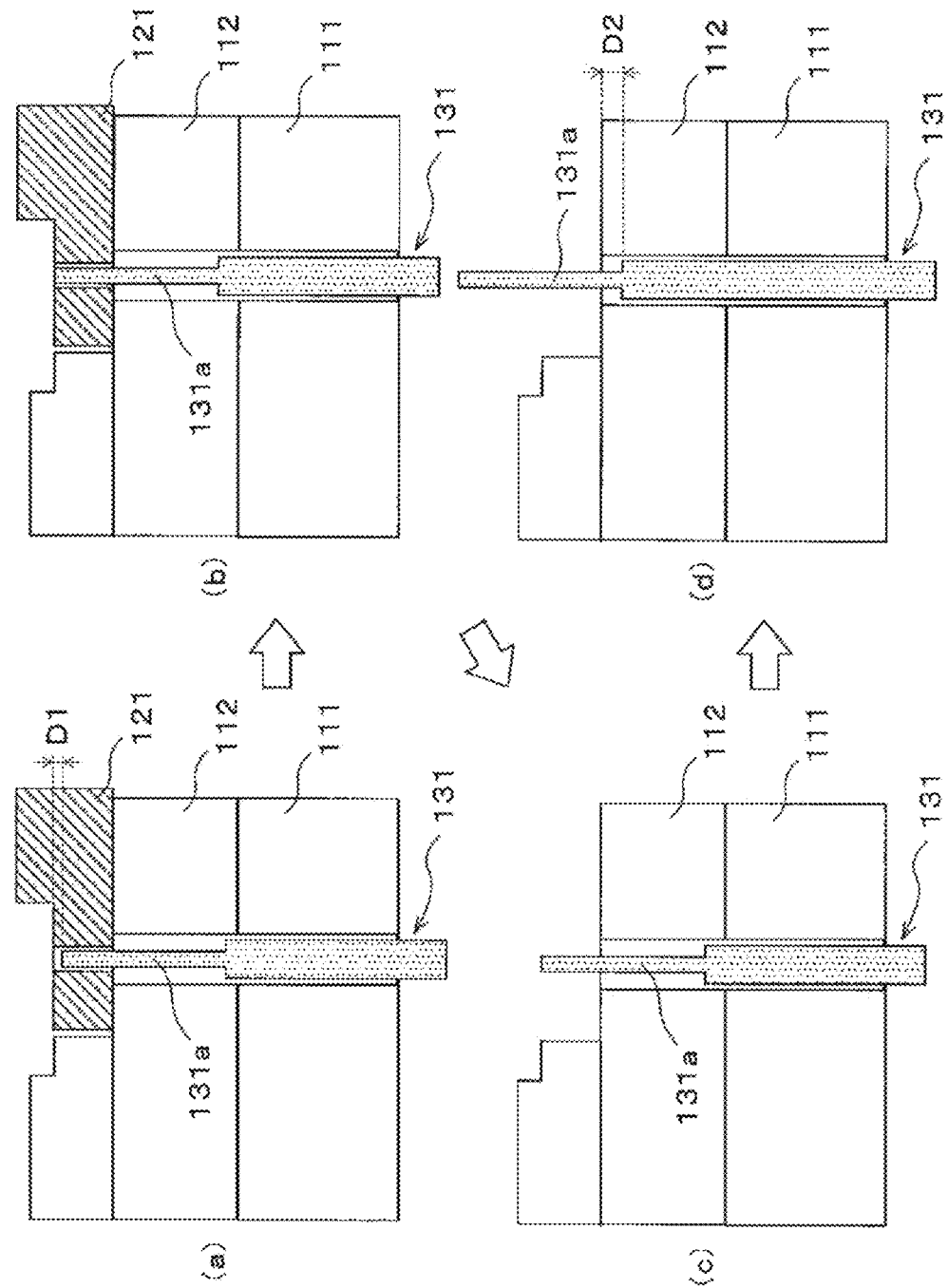
FIG. 12A is a diagram showing a series of steps for determining a thickness of the spacer.
Figure 13:
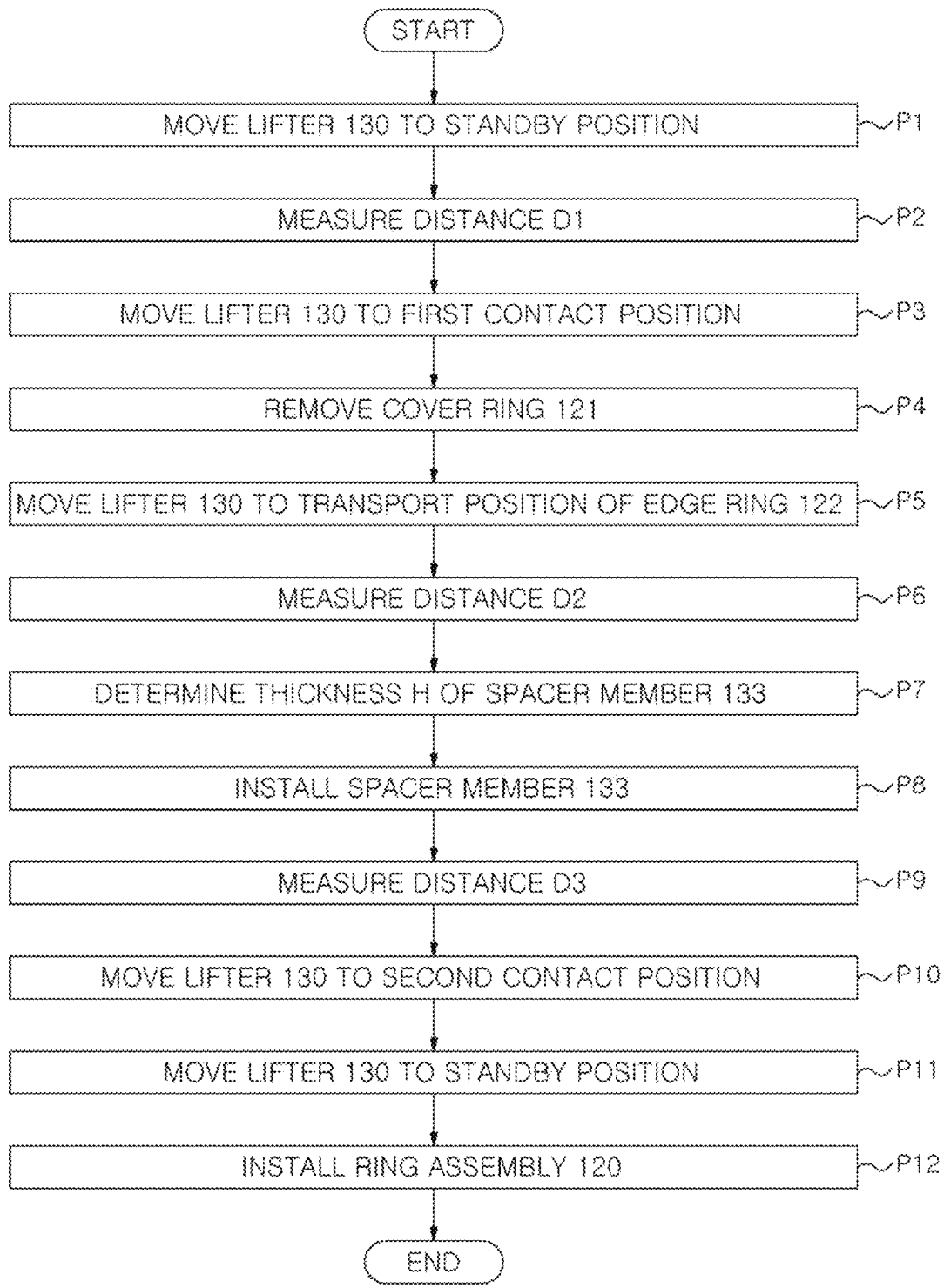
FIG. 13 is a flow chart showing a series of steps for determining the thickness of the spacer.

First, as shown in (a) of FIG. 12A, in a state in which the edge ring 122 is not supported on the upper surface of the cover ring 121, the lifter 130 is moved to a standby position (a position at which the tip end portion of the first pin portion 131a does not protrude from the upper surface of the inner peripheral portion of the cover ring 121) (Step P1 in FIG. 13). Next, in a state in which the lifter 130 is disposed in the standby position, the distance (the depth) D1 (refer to (a) of FIG. 12A) between the tip end portion of the lift pin 131 and the upper surface of the inner peripheral portion of the cover ring 121 is measured (Step P2 in FIG. 13).

A method of measuring the distance (the depth) D1 in Step P2 is not particularly limited, and it may be measured manually using, for example, a dial gauge or the like, or may be automatically measured using a laser displacement meter or the like.

Subsequently, the distance (the depth) D1 measured in Step P2 is corrected by the actuator 132, and as shown in (b) of FIG. 12A, the height position of the tip end portion of the lift pin 131 and the height position of the upper surface of the inner peripheral portion of the cover ring 121 are substantially matched (Step P3 in FIG. 13). The height position of the lifter 130 measured after the position of the tip end portion of the lift pin 131 is corrected is output to the controller 2 as a contact position (a first contact position) between the edge ring 122 and the first pin portion 131a.

Subsequently, in a state in which the position of the lifter 130 is maintained at the first contact position, the cover ring 121 is removed from an annular region 110b (the ring support surface) of the conductive base 112 as shown in (c) of FIG. 12A (Step P4 in FIG. 13).

Subsequently, as shown in (d) of FIG. 12A, the lifter 130 is moved from the contact position between the edge ring 122 and the first pin portion 131a to a transport position of the edge ring 122 (a position at which the edge ring 122 supported by the tip end portion of the first pin portion 131a reaches the specified height) (Step P5 in FIG. 13). Next, in a state in which the lifter 130 is disposed at the transport position of the edge ring 122, the distance (the depth) D2 (refer to FIG. 12A (d)) between the stepped portion S of the lift pin 131 (the upper surface of the second pin portion 131b) and the upper surface of the conductive base 112 (the support surface of the cover ring 121) is measured (Step P6 in FIG. 13).

The method for measuring the distance (the depth) D2 in Step P6 is not particularly limited, and it may be measured manually using, for example, a dial gauge or the like, or may be automatically measured using a laser displacement meter or the like.

Subsequently, the thickness H of the spacer 133 is determined so that the distance (the depth) D2 measured in Step P6 is minimized (Step P7 in FIG. 13). Next, as shown in (a) of FIG. 12B, the spacer 133 having the thickness H determined in Step P7 is installed on the stepped portion S (the upper surface of the second pin portion 131b) of the lift pin 131 (Step P8 in FIG. 13).

The spacer installed on the stepped portion S of the lift pin 131 is not limited to the spacer 133 (the first embodiment) described above, and the spacers 200, 210, 220, 230, and 250 according to the second to sixth embodiments may be appropriately selected.

Subsequently, in a state in which the spacer 133 is installed on the stepped portion S, the distance (the depth) D3 (refer to (a) of FIG. 12B) between the upper surface of the spacer 133 and the upper surface of the conductive base 112 (the support surface of the cover ring 121) is measured (Step P9 in FIG. 13).

The method of measuring the distance (the depth) D3 in Step P9 is not particularly limited, and it may be measured manually using, for example, a dial gauge or the like, or may be automatically measured using a laser displacement meter or the like.

Subsequently, the distance (the depth) D3 measured in Step P9 is corrected by the actuator 132, and as shown in (b) of FIG. 12B, the height position of the upper surface of the spacer 133 and the height position of the upper surface of the conductive base 112 (the support surface of the cover ring 121) are substantially matched (Step P10 in FIG. 13). The height position of the lifter 130 measured after the position of the upper surface of the spacer 133 is corrected is output to the controller 2 as a contact position (a second contact position) between the cover ring 121 and the spacer 133.

Then, when the lifter 130 is moved to the standby position (Step P11 in FIG. 13), as shown in (c) of FIG. 12B, and the cover ring 121 and the edge ring 122 are also sequentially placed on the annular region 110b (the ring support surface), as shown in (d) of FIG. 12B (Step P12 in FIG. 13), the method of determining the thickness H of the spacer is completed.

According to the present embodiment, since the thickness H of the spacer is appropriately determined based on the distance (the depth) D2 between the stepped portion S of the lift pin 131 and the upper surface of the conductive base 112, the loading tolerance of each member and unit of the lifter 130 can be appropriately relaxed.

Further, in such case, it is possible to add the various functions shown in the second to sixth embodiments to the spacer (the lift pin 131) in addition to relaxing the loading tolerance by appropriately selecting the spacers 200, 210, 220, 230, and 250 according to the various embodiments described above. Therefore, at least one actuator 132 is configured to vertically move the plurality of lift pins 131 between a first upper position (refer to FIG. 4A), a second lower position (refer to FIG. 4B) and a lower position (refer to FIG. 3). The first annular member 122 is disposed at the first height H1 (refer to FIG. 4A) at the first upper position, that is, the transport position of the first annular member 122. The second annular member 121 is disposed at the first height H1 (refer to FIG. 4B) at the second upper position, that is, the transport position of the second annular member 121. The plasma processing is performed when the plurality of lift pins 131 are in the lower position, that is, when the plurality of lift pins 131 are accommodated (refer to FIG. 3). In the example of FIG. 8B, the at least one actuator 132 is configured to vertically move the plurality of lift pins 131 between a first upper position, a second upper position, a third upper position and a lower position. The first upper position, the second upper position, and the upper position are the same as described above. The third upper position is a state between the first upper position and the second upper position. In this case, the third annular member 123 is disposed at the first height H1 at the third upper position, that is, the transport position of the third annular member 123. Then, the spacer 133 has a vertical dimension D determined based on the distance between the upper surface (or the upper portion) of the lower portion 131b and the lower surface of the second annular member 121 at the first upper position.

The embodiments disclosed here should be considered to be exemplary and not restrictive in all respects. The above embodiments may be omitted, replaced, or modified in various embodiments without departing from the scope of the appended claims and their gist.

The invention claimed is:

1. A plasma processing apparatus comprising:
   a plasma processing chamber;
   a plasma generator configured to generate a plasma from a processing gas in the plasma processing chamber; and
   a substrate support disposed in the plasma processing chamber,
   wherein the substrate support includes:
   a base;
   an electrostatic chuck disposed above the base and having a substrate support surface;
   a first annular member disposed to surround a substrate on the substrate support surface;
   a second annular member disposed below the first annular member and having a plurality of through holes;
   a plurality of lift pins disposed to correspond to the respective through holes, each lift pin having an upper portion having a first width and a lower portion having a second width larger than the first width, wherein the upper portion is configured to support the first annular member through the corresponding through hole of the second annular member;
at least one spacer fixed to at least one lift pin of the plurality of lift pins, the at least one spacer being disposed on the lower portion so as to surround the upper portion, and the at least one spacer being configured to support the second annular member; and
at least one actuator configured to vertically move the plurality of lift pins, and
wherein the at least one spacer is configured of a stack having a plurality of layers, and each of the plurality of layers has an insulating material or a conductive material.

2. The plasma processing apparatus of claim 1, wherein the at least one spacer is made of an insulating material.

3. The plasma processing apparatus of claim 1, wherein the at least one spacer is made of a conductive material.

4. The plasma processing apparatus of claim 2, wherein the insulating material is quartz, sapphire, $Y_2O_3$, PTFE, or PCTFE.

5. The plasma processing apparatus of claim 3, wherein the conductive material is Si or SiC.

6. The plasma processing apparatus of claim 1, further comprising a drop preventing member disposed between the upper portion and the at least one spacer and made of an FFKM-based rubber material.

7. The plasma processing apparatus of claim 1, wherein the at least one spacer has a threaded inner surface, the upper portion has a threaded outer surface, and the inner surface and the outer surface are screwed together.

8. The plasma processing apparatus of claim 1, wherein the at least one spacer has a support surface for supporting the second annular member, and the support surface is downwardly inclined from an inner portion to an outer portion of the support surface.

9. The plasma processing apparatus of claim 8, wherein the support surface has a tapered shape or a round shape.

10. The plasma processing apparatus of claim 1, wherein the substrate support further includes a third annular member disposed between the first annular member and the second annular member,
the third annular member has a plurality of additional through holes formed to correspond to the respective through holes of the second annular member,
the upper portion of the lift pin is configured to support the first annular member via the corresponding through hole of the second annular member and the corresponding additional through hole of the third annular member, and
the at least one spacer has a lower spacer portion having a third width and an upper spacer portion having a fourth width smaller than the third width, wherein the upper spacer portion is configured to support the third annular member via the corresponding through hole of the second annular member, and the lower spacer portion is configured to support the second annular member.

11. The plasma processing apparatus of claim 1, wherein the substrate support further includes a fixed member fixed to the at least one actuator,
wherein the lift pin is supported by the fixed member,
wherein the at least one spacer has a high specific gravity member and a coating layer formed to cover a surface of the high specific gravity member,
wherein the high specific gravity member includes titanium or tungsten.

12. The plasma processing apparatus of claim 1, wherein the at least one actuator is configured to vertically move the plurality of lift pins between a first upper position, a second upper position and a lower position, the first annular member is disposed at a first height when the plurality of lift pins are at the first upper position, and the second annular member is disposed at the first height when the plurality of lift pins are at the second upper position, and
the at least one spacer has a vertical dimension determined based on a distance between the lower portion and the second annular member in case that the plurality of lift pins are at the first upper position.

13. A plasma processing apparatus comprising:
a plasma processing chamber;
a plasma generator configured to generate a plasma from a processing gas in the plasma processing chamber; and
a substrate support disposed in the plasma processing chamber, wherein the substrate support includes:
a base;
an electrostatic chuck disposed above the base and having a substrate support surface;
a first annular member disposed to surround a substrate on the substrate support surface;
a second annular member disposed below the first annular member and having a plurality of through holes;
a plurality of lift pins disposed to correspond to the respective through holes, each lift pin having an upper portion having a first width and a lower portion having a second width larger than the first width, wherein the upper portion is configured to support the first annular member through the corresponding through hole of the second annular member;
at least one spacer fixed to at least one lift pin of the plurality of lift pins, the at least one spacer being disposed on the lower portion so as to surround the upper portion, and the at least one spacer being configured to support the second annular member;
at least one actuator configured to vertically move the plurality of lift pins; and
a drop preventing member disposed between the upper portion and the at least one spacer and made of an FFKM-based rubber material.

14. A plasma processing apparatus comprising:
a plasma processing chamber;
a plasma generator configured to generate a plasma from a processing gas in the plasma processing chamber; and
a substrate support disposed in the plasma processing chamber,
wherein the substrate support includes:
a base;
an electrostatic chuck disposed above the base and having a substrate support surface;
a first annular member disposed to surround a substrate on the substrate support surface;
a second annular member disposed below the first annular member and having a plurality of through holes;
a plurality of lift pins disposed to correspond to the respective through holes, each lift pin having an upper portion having a first width and a lower portion having a second width larger than the first width, wherein the upper portion is configured to support the first annular member through the corresponding through hole of the second annular member;
at least one spacer fixed to at least one lift pin of the plurality of lift pins, the at least one spacer being disposed on the lower portion so as to surround the upper portion, and the at least one spacer being configured to support the second annular member; and at least one actuator configured to vertically move the plurality of lift pins, wherein the at least one spacer has a threaded inner surface, the upper portion has a threaded outer surface, and the inner surface and the outer surface are screwed together.

15. A plasma processing apparatus comprising:

a plasma processing chamber;

a plasma generator configured to generate a plasma from a processing gas in the plasma processing chamber; and a substrate support disposed in the plasma processing chamber, wherein the substrate support includes:

a base;

an electrostatic chuck disposed above the base and having a substrate support surface;

a first annular member disposed to surround a substrate on the substrate support surface;

a second annular member disposed below the first annular member and having a plurality of through holes;

a plurality of lift pins disposed to correspond to the respective through holes, each lift pin having an upper portion having a first width and a lower portion having a second width larger than the first width, wherein the upper portion is configured to support the first annular member through the corresponding through hole of the second annular member;

at least one spacer fixed to at least one lift pin of the plurality of lift pins, the at least one spacer being disposed on the lower portion so as to surround the upper portion, and the at least one spacer being configured to support the second annular member;

at least one actuator configured to vertically move the plurality of lift pins; and a third annular member disposed between the first annular member and the second annular member, wherein the third annular member has a plurality of additional through holes formed to correspond to the respective through holes of the second annular member, wherein the upper portion of the lift pin is configured to support the first annular member via the corresponding through hole of the second annular member and the corresponding additional through hole of the third annular member, and wherein the at least one spacer has a lower spacer portion having a third width and an upper spacer portion having a fourth width smaller than the third width, wherein the upper spacer portion is configured to support the third annular member via the corresponding through hole of the second annular member, and the lower spacer portion is configured to support the second annular member.

* * * * *